(12) United States Patent
Kurts et al.

(10) Patent No.: US 7,227,377 B2
(45) Date of Patent: *Jun. 5, 2007

(54) APPARATUS AND METHOD FOR BUS SIGNAL TERMINATION COMPENSATION DURING DETECTED QUIET CYCLE

(75) Inventors: Tsvika Kurts, Haifa (IL); Zelig Wayner, Haifa (IL); Tommy Bojan, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/026,651

(22) Filed: Dec. 31, 2004

(65) Prior Publication Data

US 2005/0151562 A1    Jul. 14, 2005

Related U.S. Application Data

(63) Continuation of application No. 10/335,032, filed on Dec. 31, 2002, now Pat. No. 6,842,035.

(51) Int. Cl.
*H03K 19/003* (2006.01)
(52) U.S. Cl. .............................. 326/30; 326/33; 326/34
(58) Field of Classification Search ............ 326/30–34, 326/86, 90
See application file for complete search history.

(56) References Cited

U.S. PATENT DOCUMENTS

| | | | |
|---|---|---|---|
| 5,521,528 A | 5/1996 | Mammano et al. | |
| 5,535,406 A | 7/1996 | Kolchinsky | |
| 5,970,254 A | 10/1999 | Cooke et al. | |
| 6,157,206 A | 12/2000 | Taylor et al. | |
| 6,282,627 B1 | 8/2001 | Wong et al. | |
| 6,300,789 B1 | 10/2001 | Ball | |
| 6,356,105 B1 | 3/2002 | Volk | |
| 6,418,500 B1* | 7/2002 | Gai et al. | 710/305 |
| 6,424,170 B1 | 7/2002 | Raman et al. | |
| 6,573,747 B2 | 6/2003 | Radhakrishnan | |
| 6,762,620 B2* | 7/2004 | Jang et al. | 326/30 |
| 2001/0005868 A1 | 6/2001 | Muljono | |
| 2003/0235084 A1 | 12/2003 | Zumekhr et al. | |

FOREIGN PATENT DOCUMENTS

| | | |
|---|---|---|
| JP | 11145814 | 5/1999 |
| WO | WO 02/27930 A2 | 4/2002 |

OTHER PUBLICATIONS

PCT Search Report, PCT/US03/39634, dated Jan. 11, 2005, 9 pages.

* cited by examiner

*Primary Examiner*—Anh Q. Tran
(74) *Attorney, Agent, or Firm*—Blakely, Sokoloff, Taylor & Zafman LLP

(57) ABSTRACT

A value to better match a termination circuit to a characteristic impedance of a bus signal line is determined. A determination is also made as to when a bus, that includes the line and that is being used by a bus agent in its normal mode of operation, will be available for adjusting the termination circuit in a Quiet Cycle, based at least on knowledge of the bus protocol and tracking of certain bus protocol events. The termination circuit is adjusted according to the determined value, during the Quiet Cycle.

12 Claims, 13 Drawing Sheets

APPARATUS AND METHOD FOR BUS SIGNAL TERMINATION COMPENSATION DURING DETECTED QUIET CYCLE

This is a Continuation of U.S. patent application Ser. No. 10/335,032, filed Dec. 31, 2002 now U.S. Pat. No. 6,847,035.

BACKGROUND

One or more embodiments of the invention relate generally to the field of high-speed bus communications and more particularly to a method and apparatus for bus signal termination compensation via detection of a "Quiet Cycle" during normal bus operation.

Communications between devices that make up an electronic system are typically performed using one or more buses that interconnect such devices. These buses may be dedicated buses coupling only two devices, or they may be used to connect more than two devices. The buses may be formed entirely on a single integrated circuit die, thus being able to connect two or more devices on the same chip. Alternatively, a bus may be formed on a separate substrate than the devices, such as on a printed wiring board.

Modern systems such as advanced desktop and notebook computers are optimized to run at high bus speeds or bus dock frequencies, for greater performance. In such cases, proper bus signal termination, which matches the characteristic impedance of a bus line, is needed to avoid unwanted signal reflections that can interfere with bus communications.

Within advanced electronic systems, bus signal termination may be provided by on-chip termination resistors. Unfortunately, these resistors generally have an effective resistance that is not constant and instead changes as a function of several parameters, including fabrication parameters, signal voltage level, power supply voltage, and temperature. These parameters can introduce a variation in effective resistance of nearly 2:1. As a result, achieving proper termination in practice generally requires the use of on-chip, adjustable termination circuits.

Typically, the adjustable termination circuits within a manufactured device, such as a processor integrated circuit die, implement a linear compensation scheme to compensate for variations in termination resistors. In such a scheme, resistance changes are continuous (typically under the control of an analog bias voltage), rather than in discrete steps. The desired compensation may be determined, for example, by in effect measuring the resistance of the termination resistor relative to that of a reference resistor (typically an external or off-chip precision resistor), to determine the difference. This may be done during initial startup or reset of the processor, and then the on-die termination circuits are adjusted only once, prior to enabling the start of normal operation of the processor. With linear compensation schemes, it may be possible to update the termination circuit "on the fly", that is while the bus is being used for communicating data symbols, without hampering the transmission and receipt of symbols on the bus.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
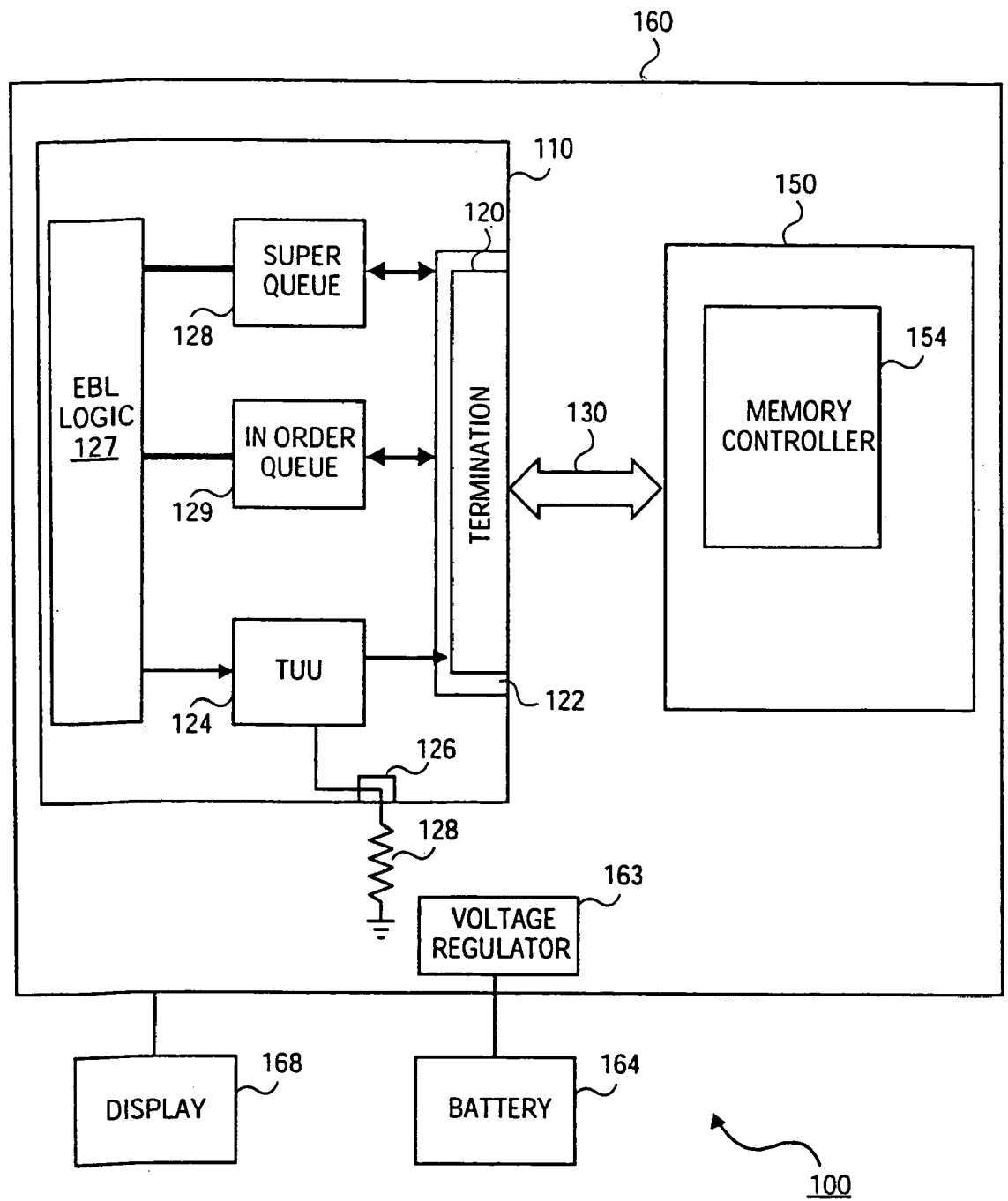
FIG. 1 is a block diagram illustrating an advanced architecture computer system, including an integrated circuit die with a built-in termination update unit (TUU) that can automatically detect an available time interval, i.e. a Quiet Cycle, for updating termination circuits.

A method and apparatus for compensating for variations in bus signal termination are described. According to an embodiment, a termination update unit (TUU) within an integrated circuit (IC) die determines one or more compensation values for the termination of the die's bus input/output (I/O) buffer signals. This is referred to as determining the impedance compensation of one or more buffers, or Rcomp measurement for short. Next, the TUU automatically adjusts (or updates) the termination circuit according to the determined compensation values, during a "Quiet Cycle" of the bus, which occurs during normal bus operation. The TUU detects or drives the Quiet Cycle by, for example, sampling bus signals and receiving information regarding pending transactions on the bus. Based on knowledge of the bus protocol, the tracking of bus protocol events, and the current power management mode of a bus agent, the Quiet Cycle is selected such that the update to the termination circuits, which occurs during the Quiet Cycle, may be for the most part transparent to the agents on the bus. The Quiet Cycle update can also be useful in situations where it may be difficult to guarantee a symmetric bus agent (such as a processor) ownership of the bus for three sequential bus clock periods.

The Quiet Cycle update may be repeated automatically, for example, at every predetermined time interval, during normal bus operation. The updates can occur repeatedly, without having to change the power management mode of the bus agents, until the system is shut down. Each Quiet Cycle update may be preceded by a respective measurement of the compensation values (during so-called Rcomp cycles), to ensure greater precision in the termination.

In some cases, such as in digital implementations of Rcomp (to be described below), an I/O buffer should not receive valid data, address, or control information over its bus line while simultaneously updating the termination circuit for that bus line. This may be accomplished by positioning the Quiet Cycle in one or more bus clock periods (or simply bus clocks) during which essentially no toggling of the high speed bus signals associated with the buffers being updated can be expected. According to an embodiment of the invention, high speed signals are those which toggle at twice or four times the speed of a common bus clock (also referred to as double pump or quad pump signals). These high speed signals include the address and data signals on a processor's system bus. Some activity of special treatment signals on other bus signal lines, such as bus request, address strobe, and other low speed control signals that operate no faster than the common bus clock, may be allowed during a Quiet Cycle.

The Quiet Cycle may also include margin time, to allow all transition phenomena to propagate across the bus and dissipate before the high speed signals resume. That is because at the extremely high speeds at which the bus may operate (with double and quad pump signaling, for example), the bus behaves as a transmission line which requires some time to recover and be ready for the next input signals, following updating of the buffers.

System Architecture

To illustrate the principles of the various embodiments of the invention, the system in FIG. 1 will be used as an example. FIG. 1 depicts a block diagram of an advanced electronic system 100 built on a printed wiring board 160. The system 100 may be a mobile unit, having all elements including a display 168 and battery 164 to power all of the functions of the system, integrated into a portable housing. A voltage regulator 163, that may be located on the board 160, is used to provide a regulated power supply voltage to the IC dies 110, 150. An alternative would be a desktop unit, a server unit, or another type of system such as a network switch or router, that does not have the display 168 or the battery 164 integrated into the same portable housing. The hardware architecture and bus protocol in such a board system will be described first, before describing how they may be modified to implement Rcomp and Quiet Cycle, according to various embodiments of the invention.

In FIG. 1, integrated circuit dies 110 and 150 are communicatively coupled to each other by a bus 130. The dies 110, 150 may be processor and chipset dies, respectively, coupled to each other via a system bus of a computer motherboard. An adjustable bus signal termination circuit 120 is shown as part of the die 110. The termination circuit 120 may be part of the on-chip I/O buffers 122 of the die 110. The I/O buffers 122 may serve to translate between bus line signaling voltage levels and on-chip levels, as well as provide fanout when driving the bus. See FIG. 11 described below under the section entitled "RCOMP" for an example of part of an I/O buffer circuit. Rcomp and Quiet Cycle updates are under the control of a termination update unit (TUU 124) that, in the embodiment shown in FIG. 1, is an on-chip logic unit. Additional elements of the IC die 110 and the system 100 shown in FIG. 1 will be introduced below, as the relevant embodiments of the invention are described in turn.

Taking the processor and a component of the chipset (such as a memory controller 154) as an example, these components may be referred to as agents on a system bus. Each agent may be required to arbitrate for accessing the bus 130, by asserting a bus request signal. The memory controller 154 may be the priority agent on the bus 100, while the processor may be a symmetric agent. A priority agent is awarded bus access when competing with one or more symmetric agents, unless a symmetric agent locks ownership of the bus by asserting its lock signal (LOCK#).

A bus transaction can exhibit several bus protocol events. These include an arbitration event to determine bus ownership. Thereafter, the transaction enters the request phase where the bus owner drives transaction address information. To properly interact with the bus at each stage of the appropriate transaction, each agent may maintain an in-order queue (IOQ 129). The IOQ 129 contains information regarding all pending bus transactions independently issued by a transaction request agent. When each transaction receives a response guarantee, during the response phase of the transaction, indicating that the transaction will now be completed, the agent deletes the transaction from the IOQ 129. If the transaction includes a data transfer phase, the transaction enters the data phase, which may be indicated by the issuance of a data ready (DRDY#) signal.

Bus arbitration events may involve the following situations. When a symmetric agent such as the processor wants to access the bus, it asserts a bus request signal (BREQ#). On the other hand, when a priority agent desires bus ownership, the priority agent asserts a priority bus agent request signal (BPRI#). In most cases, an agent that obtains ownership of the bus deasserts its bus request signal (e.g., BREQ#) once it obtains bus ownership and has no more transactions to drive.

Having described the general hardware architecture and an overview of the bus protocol of the system 100, additional features of the integrated circuit (IC) die 110 that will play a role in Rcomp and Quiet Cycle operation will now be described.

An advanced processor can operate under multiple power management modes or states, to yield a more efficient system from a power standpoint. For example, state C0 generally refers to normal execution or a normal power consumption state at which the maximum amount of power is typically utilized. The Rcomp and Quiet Cycle updates described below may be performed in essentially all operating modes of the IC die 110.

A second power consumption or management state is C1, also referred to as the AutoHalt or stop grant state. A processor transitions from C0 into C1 when a halt instruction is executed during normal operation. As an alternative, the transition into the stop grant state can occur when a stop clock (STPCLK#) signal, being an input to the processor, is asserted. During C1, the processor powers down all logic necessary for recognition of interrupts and the snooping of memory, and deasserts as many open drain bus signals as possible (to avoid current sinks and thus reduce power consumption). However, the bus clock may continue to run in the state C1.

A third power management state is C2, also referred to as "sleep state." Typically, a transition into the sleep state may occur when an input sleep signal (SLP#) is asserted during operation in the stop grant state (C1). Upon entering the sleep state, the processor powers down much of its logic including that which is necessary for snooping external memory accesses and latching internal events. In addition, the sleep state (C2) causes the processor to maintain the contents of its registers and caches, and monitors for interrupt events such as processor reset. The processor's phase-locked loops (PLLs) continue to run in the C2 power management state.

A fourth power management state is C3, also referred to as the "deep sleep" state. This is the lowest power consumption state that the processor can be in and still maintain the contents of its registers and caches. The deep sleep state (C3) can generally only be entered after the processor has entered the sleep state. Generally, the processor enters the deep sleep state immediately when the chipset or other motherboard logic stops the bus clock that is fed to the processor's phase locked loop (PLL). Alternatively, the electronic system 100 may generate a deep sleep signal (DPSLP#) that signals the processor to enter the C3 state. To exit the deep sleep state (C3) and return to the sleep state (C2), the bus clock may be restarted and allowed to run for a period of at least one millisecond.

Quiet Cycle

FIGS. 2–4, 7, and 9 illustrate timing diagrams of various scenarios in which a termination update unit (TUU), that may be located on-chip with a symmetric agent (such as a processor), detects when the bus is available for a Quiet Cycle update. These timing diagrams are applicable to a uni-processor system in which there is only one processor on the system bus. However, the concept of the Quiet Cycle for termination updates can also be applied to a multiprocessor system, by making suitable modifications to the TUU so that it has knowledge of the relevant bus protocol and responds to the appropriate bus protocol events on the multiprocessor bus.

Figure 2:
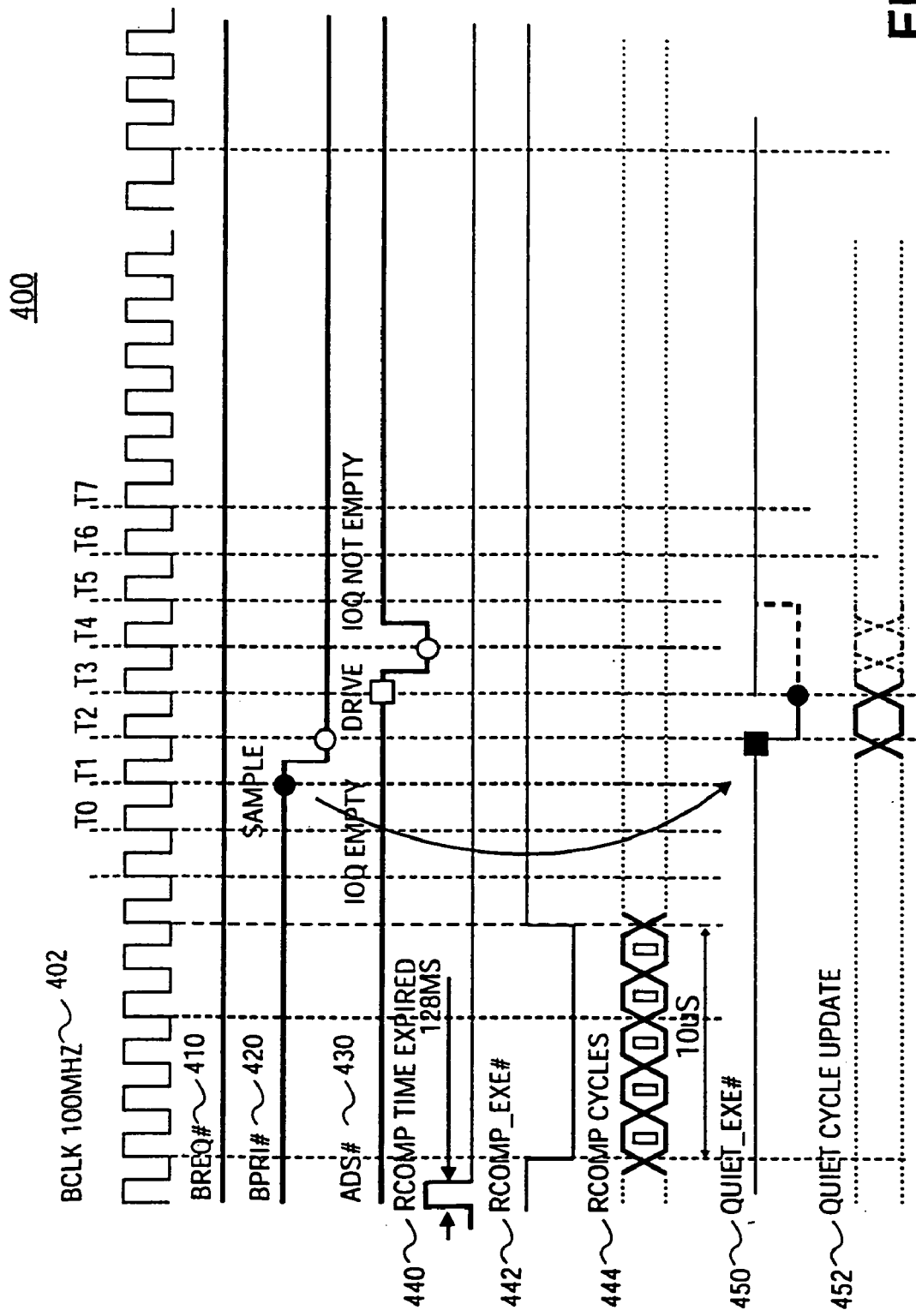
FIG. 2 is a timing diagram illustrating bus signals and on-chip signals that may be used by the TUU in detecting a Quiet Cycle time interval for termination update, where a bus agent does not yet own the bus.

Beginning with FIG. 2, this figure shows a timing diagram 400 that illustrates detection of a Quiet Cycle during any one of the C0, C1, and C2 power management modes of a bus agent. The timing diagram 400 in that figure has bus signal waveforms for a bus clock 402 (T0, . . . , T7), a bus request signal (BREQ#) 410, a priority agent bus request signal (BPRI#) 420, and an address strobe signal (ADS#) 430. The diagram 400 also has several waveforms that represent activity in the TUU and the termination circuits. These include Rcomp cycles 444, followed by a Quiet Cycle update 452. The diagram 400 may represent system activity during any one of the power management states C0, C1, and C2 of the symmetric agent.

Note that the Quiet Cycle may be performed as soon as possible after having determined the new compensation values in Rcomp. In the embodiment shown in Fib. 2, Rcomp takes 10 microseconds to determine the new compensation values for on-die termination within the IC die 110. No special timing issues are presented if Rcomp update is performed by the TUU using conventional techniques that do not affect the signal transitions occurring on the bus. Rcomp can be performed "on the fly" during almost any operating mode, using dedicated compensation determination circuitry.

The combination of Rcomp and Quiet Cycle may be started following a 128 millisecond (ms) delay after a previous buffer strength update (i.e., a previous Quiet Cycle), as shown. However, those skilled in the art will recognize that this interval may be different, depending upon, for example, the desired trade off between bus performance and impedance tracking speed, and may, in many instances, fall within the range 4 ms–128 ms.

Bus availability for Quiet Cycle update is detected by the TUU sampling the BPRI# signal 420 and the BREQ# signal 410, after the Rcomp cycles 444 are over. This is an example of the TUU monitoring arbitration events on the bus. Note that the IOQ 129 of the symmetric agent (see FIG. 1) happens to be empty at this time, i.e., there are no pending transactions on the bus. As illustrated, both BREQ# 410 and BPRI# signal 420 are inactive at bus clock T1. This can mean several things, depending on the bus protocol. For example, under the Front Side Bus protocol used by certain processors of Intel Corp., Santa Clara, Calif., there is at least one bus clock gap defined between assertion of BPRI# and ADS# by the priority agent. In that case, in view of the BPRI# signal 420 being deasserted at bus clock T1, the bus should be available for Quiet Cycle update at least during the next bus clock period, T2.

In one embodiment, the terminations for all address signals and certain control signals of the bus are updated during a first clock period of the Quiet Cycle (here, T2). As to the data signals, these may require additional bus clock periods to update their terminations (here, T2–T4). In the scenario of FIG. 2, this is permissible because, even though ADS# has been asserted in T3, under the FSB protocol, a minimum of five bus clocks are required between ADS# and the first data transfer (e.g., when DRDY# is first asserted).

Figure 3:
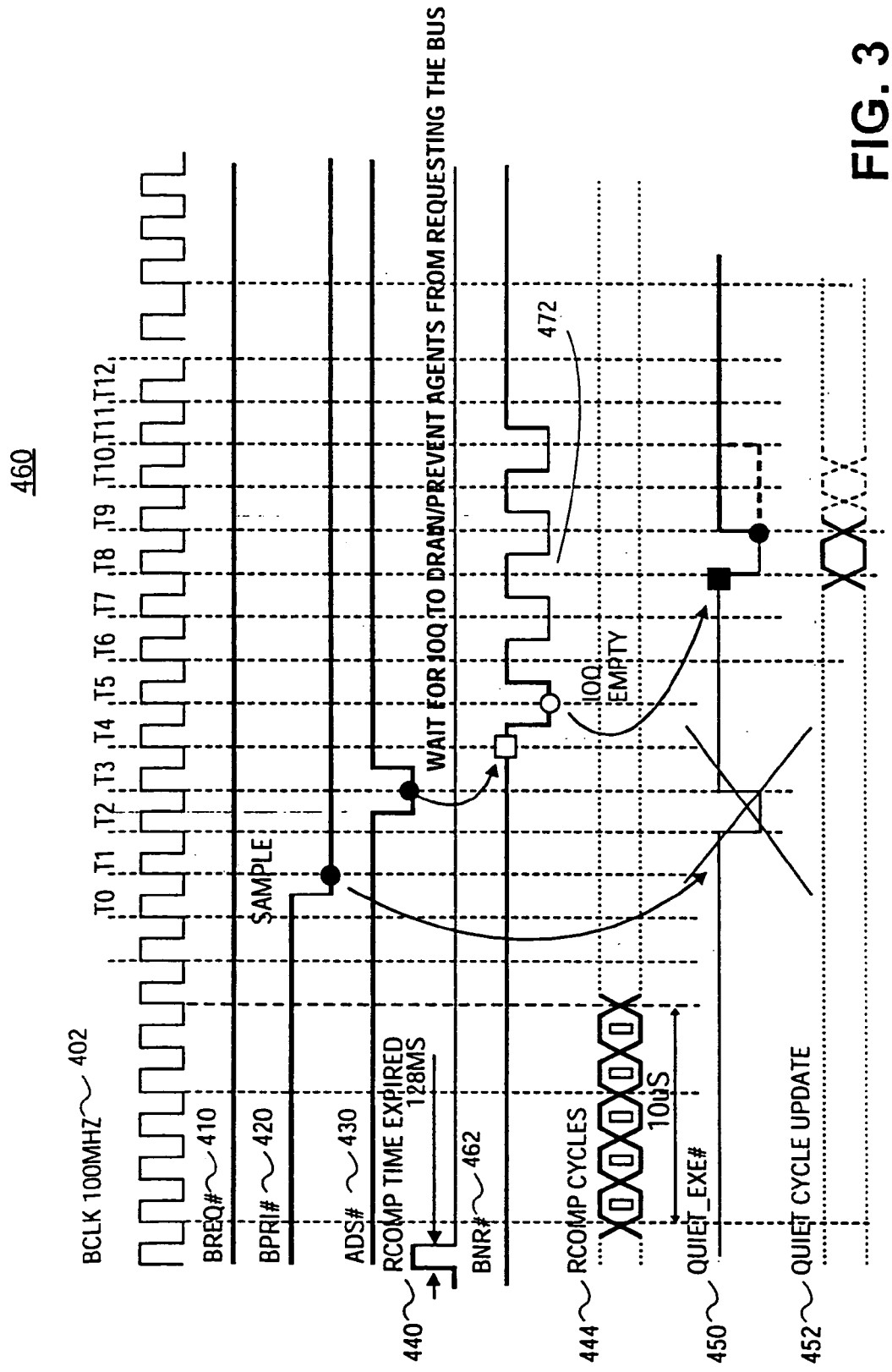
FIG. 3 is a timing diagram showing signals involved in another scenario for termination update, where a priority agent owns the bus.

FIG. 3 is a timing diagram 460 that depicts a situation where the priority agent (e.g., the memory controller 154 in the IC die 150 of FIG. 1) has established ownership of the bus when the TUU starts to sample BPRI# after Rcomp is over. This is in contrast to FIG. 2, which shows Quiet Cycle being detected while the priority agent does not own the bus. In FIG. 3, the BPRI# signal 420 is sensed as asserted during bus clock T1. Accordingly, under certain bus protocols, such as FSB, the TUU cannot guarantee that the bus will be available for Quiet Cycle update during bus clock T2. The TUU in this case then samples the ADS# signal 430 until the signal is asserted by the priority agent. This is an example of the TUU monitoring the request phase of a transaction on the bus. Once ADS# signal 430 is asserted by the priority agent, the TUU will throttle a block next request signal (BNR#) 462.

BNR# signal 462 is a bus protocol signal utilized to prevent agents (including the symmetric agent in the IC die 110) from issuing additional arbitration requests for bus ownership and transaction requests. However, even though this prevents agents from initiating new bus activity, the bus may remain active due to pending bus transactions.

Accordingly, as illustrated with reference to FIG. 3, the TUU will throttle the BNR# signal until the symmetric agent's IOQ is drained of pending transactions, at which time the TUU can expect an upcoming Quiet Cycle to be available. The BNR# signal 462 may be throttled for an additional two clock cycles once the IOQ is found to be empty, to allow transition phenomena on the bus to dissipate. At bus clock T8, the TUU establishes a Quiet Cycle for bus clocks T8–T10. Furthermore, the TUU continues throttling of the BNR# signal 462 during the Quiet Cycle. Note that the timing diagram in FIG. 3 may depict the detection of Quiet Cycle in any one of the C0, C1, and C2 power management modes described above.

Figure 4:
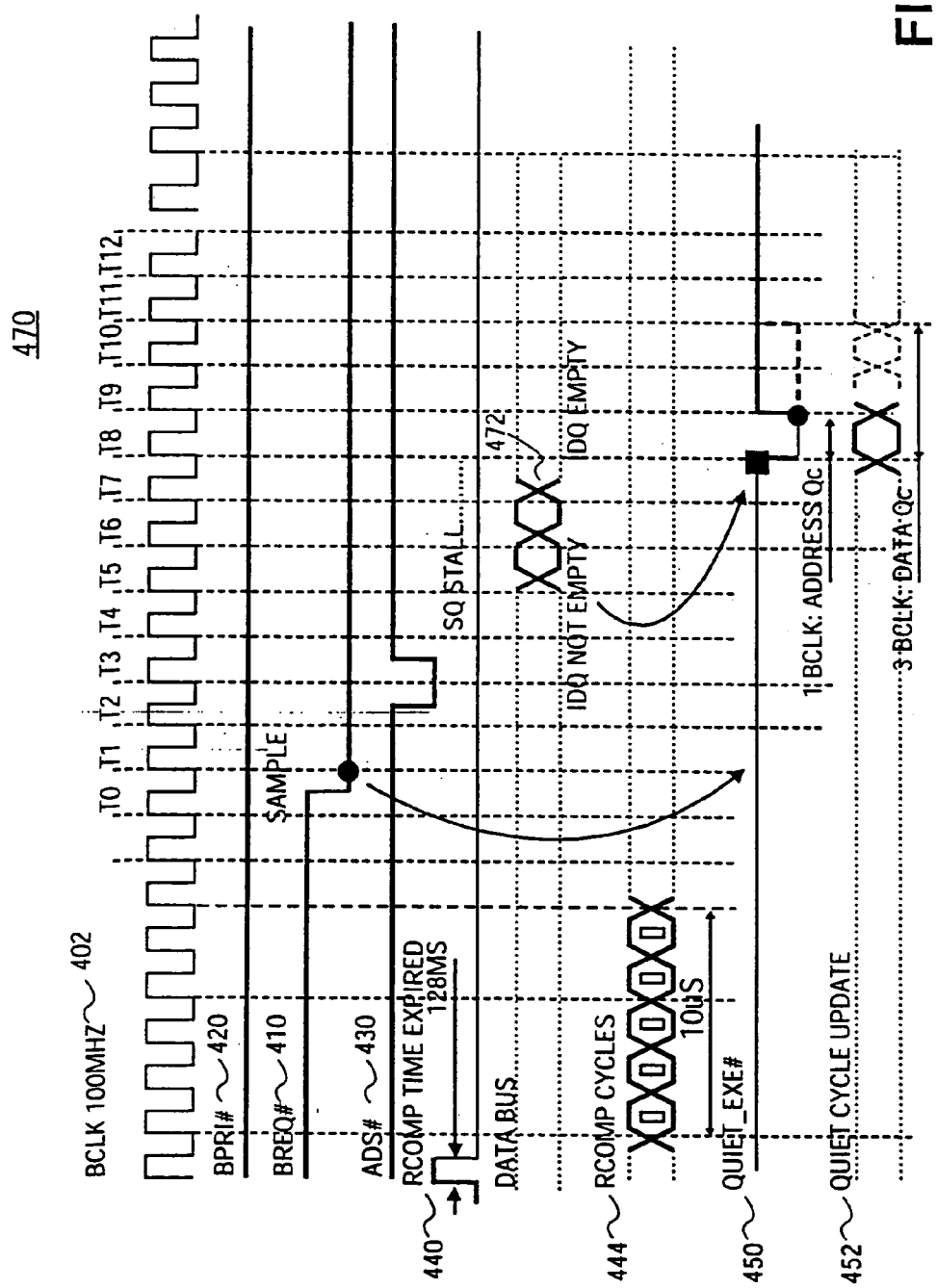
FIG. 4 is a timing diagram depicting signals involved in yet another scenario for termination update, where a non-priority agent owns the bus.

FIG. 4 is an additional timing diagram illustrating how to detect Quiet Cycle when the symmetric agent (e.g. processor) has bus ownership. This timing diagram applies to the detection of a Quiet Cycle during the C0 power mode, and in particular where the priority agent is not requesting bus ownership. When the TUU first samples the bus signals (after Rcomp has been completed), at bus clock T0, the symmetric agent is attempting to establish bus ownership by asserting BREQ# signal 410. In that case, the TUU determines whether the IOQ (of the symmetric agent) is empty.

If the symmetric agent IOQ is empty, the Quiet Cycle update may proceed as shown in FIG. 2.

However, in the event the IOQ is not empty, the situation as in fact depicted in FIG. 4 unfolds, where the TUU stalls requests in the symmetric agent's super queue 128 (see FIG. 1). The term "super queue" refers to a mechanism that centralizes all requests from internal memory agents (e.g., data and code cache, second level cache, etc.) of the processor IC die 110, and serves the requests. All the requests that are not found in one of the internal memories are driven to the bus by way of extended bus logic (EBL) 127 (see FIG. 1). Only when a request is served (i.e., data is driven back to requester) its entry is removed from the super queue. However, if the requests entering the super queue 128 are stalled, eventually all current transactions will be served and the super queue will become empty.

According to an embodiment of the invention, the TUU monitors the status of the IOQ 129. Given enough time, all transactions in the IOQ will be completed. Consequently, because the TUU has stalled further requests to the symmetric agent's super queue 129, following a given number of bus clock periods, activity on the address and data lines of the bus should stop. Accordingly, at bus clock T8, the TUU can expect that the bus is available for termination update during bus clocks T8–T10 (because it is monitoring and then knows the IOQ is empty and the super queue is stalled, even though the symmetric agent is asserting BREQ#).

Figure 5:
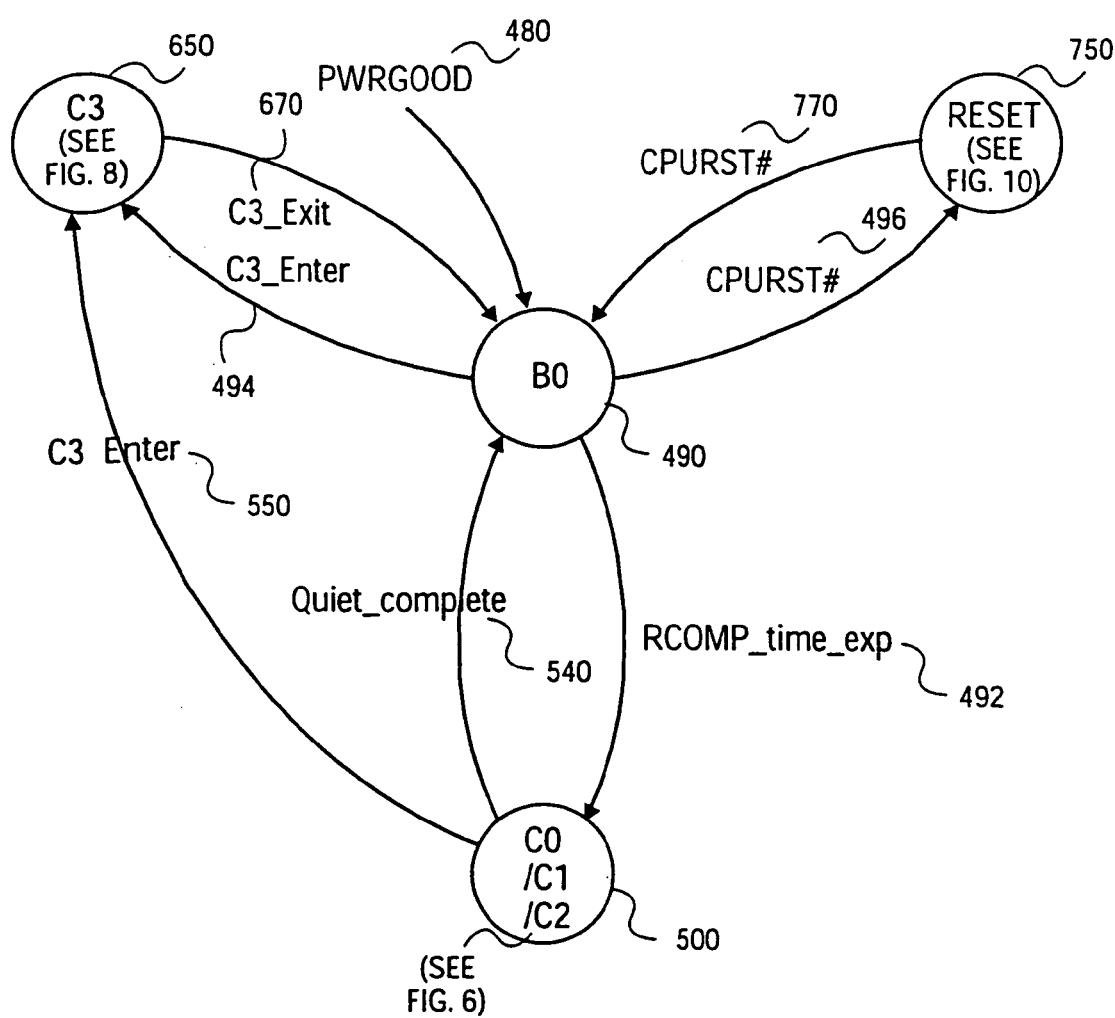
FIG. 5 is a block diagram illustrating a state machine for use in the TUU.

FIG. 5 is a block diagram illustrating a Quiet Cycle state machine 800 that organizes the capabilities of the TUU 124 (see FIG. 1) as part of a processor IC die. FIGS. 6–9 to be described below are detail views of certain operations introduced in FIG. 5. As indicated, PWRGOOD# signal 480 initiates operation of the processor within state 490 (B0). However, detection of a CPU reset signal 496 will cause control flow to perform the process of flow chart 752 (see FIG. 10). Once the CPURST# signal is deasserted 770, control flow returns to process block 490. Once Rcomp time expires 492, control flow transitions to process block 500 wherein Quiet Cycle execution is performed according to the process of flow chart 502 (see FIG. 6). Once Quiet Cycle update has been completed 540, control flow returns to process block 490. Otherwise, if a C3 power management state condition is detected 550, control flow transitions to C3 state 650, wherein process 652 (FIG. 8) is performed. Once the process 652 is complete and a C3 exit 670 is performed, control flow returns to state 490 (B0). Note that the reverse may also occur, namely that state 650 is entered if the processor performs a C3 enter (494).

Figure 6:
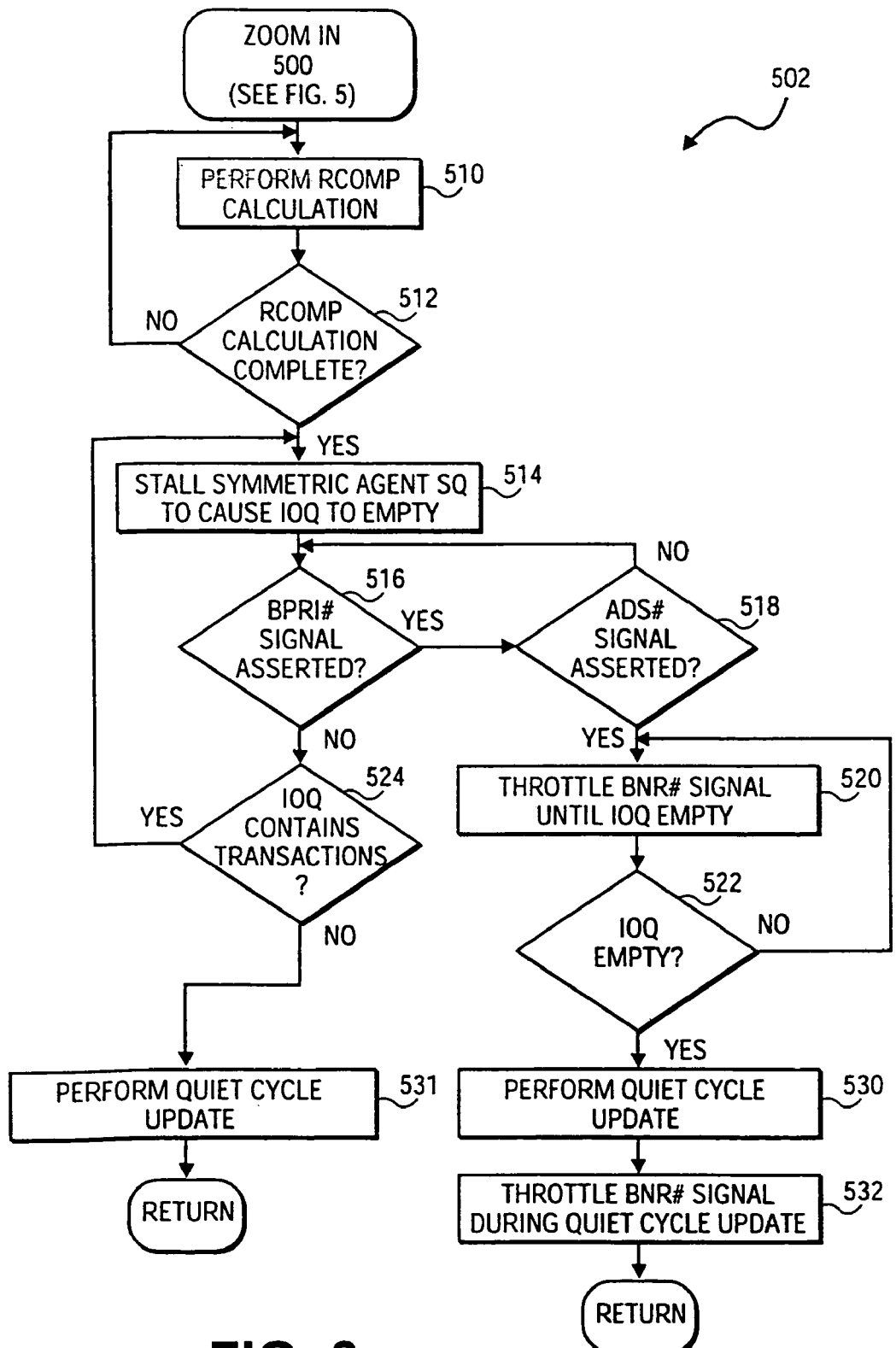
FIG. 6 is a flow chart illustrating a termination update procedure being performed during any one of several power management modes of a bus agent.

Referring now to FIG. 6, FIG. 6 is a flow chart 502 illustrating Quiet Cycle detection in state 500 of the state machine (see FIG. 5), according to various embodiments of the invention (such as those described above with respect to the timing diagrams). The process begins with the TUU being in state 500. At process block 510, Rcomp execution is performed such that compensation values (such as impedance values and/or buffer strength values) are calculated for I/O buffers of the symmetric agent.

Once Rcomp computation is complete, at process block 512, the super queue of the symmetric agent is stalled, to cause the symmetric agent's IOQ to empty (block 514). Next, at process block 516, it is determined whether the BPRI# signal is asserted. When such is not the case, process block 524 is performed where it is determined whether the symmetric agent's IOQ is empty. When the IOQ is empty, process block 531 is performed. Otherwise, control flows to process block 514. At process block 531, a Quiet Cycle update is performed, to update the termination circuits of the various I/O buffers of the symmetric agent.

If BPRI# signal is asserted (block 516), process block 518 is performed to determine whether ADS# signal is asserted. Once asserted, process block 520 is performed. At process block 520 the TUU will throttle the BNR# signal until the symmetric agent's IOQ is empty (checked in decision block 522). Once the IOQ is empty, operation proceeds with process blocks 530 and 532, where the TUU will throttle the BNR# signal during Quiet Cycle execution. Once the termination circuit update is complete, control flow returns to the state 490 (B0).

Figure 7:
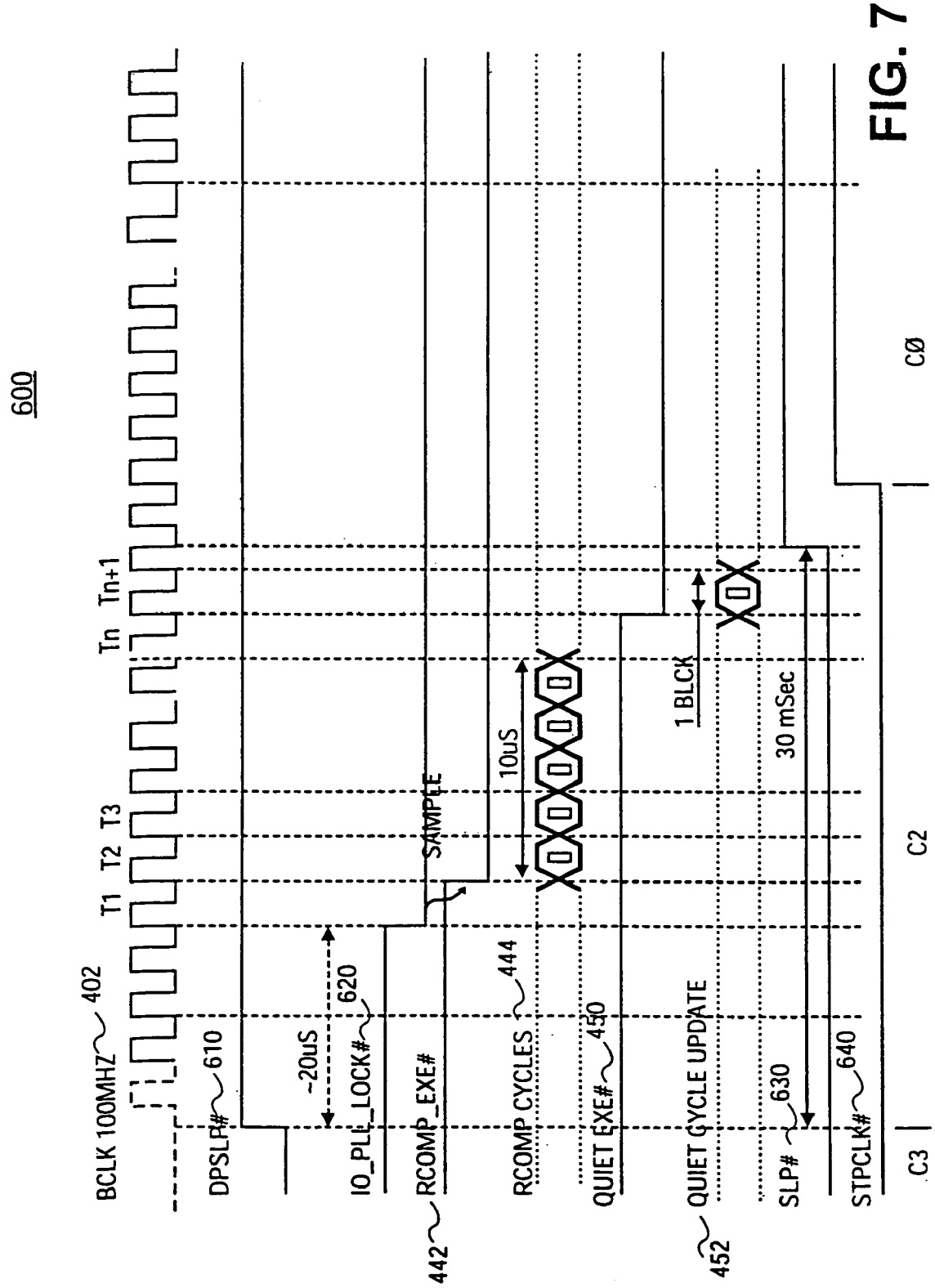
FIG. 7 is a timing diagram illustrating a termination update procedure following a bust agent's exit from a certain low power consumption state.

Referring now to FIG. 7, FIG. 7 is a timing diagram 600 illustrating Quiet Cycle detection and performance during C3 exit 670 (see FIG. 5). As indicated above, the C3 power management state refers to a "deep sleep" state. A symmetric agent detects entry into the deep sleep state by assertion of deep sleep signal (DPSLP#610).

Once DPSLP#610 is deasserted, the TUU will perform Rcomp execution 442 once an I/O clock is stable (the core PLL need not be locked). Stability of the I/O clock is generally indicated once an I/O PLL lock signal is active (IO_PLL_LOCK#620). Quiet Cycle execution 450 then begins in the C2 state, without checking the bus request signals. The various power consumption states through which the symmetric agent passes are indicated in FIG. 7. Quiet Cycle execution during C3 exit is performed in this case within the 30 ms allotted between deassertion of DPSLP# signal 610 and deassertion of SLP# signal 630, as defined in certain bus protocols.

Figure 8:
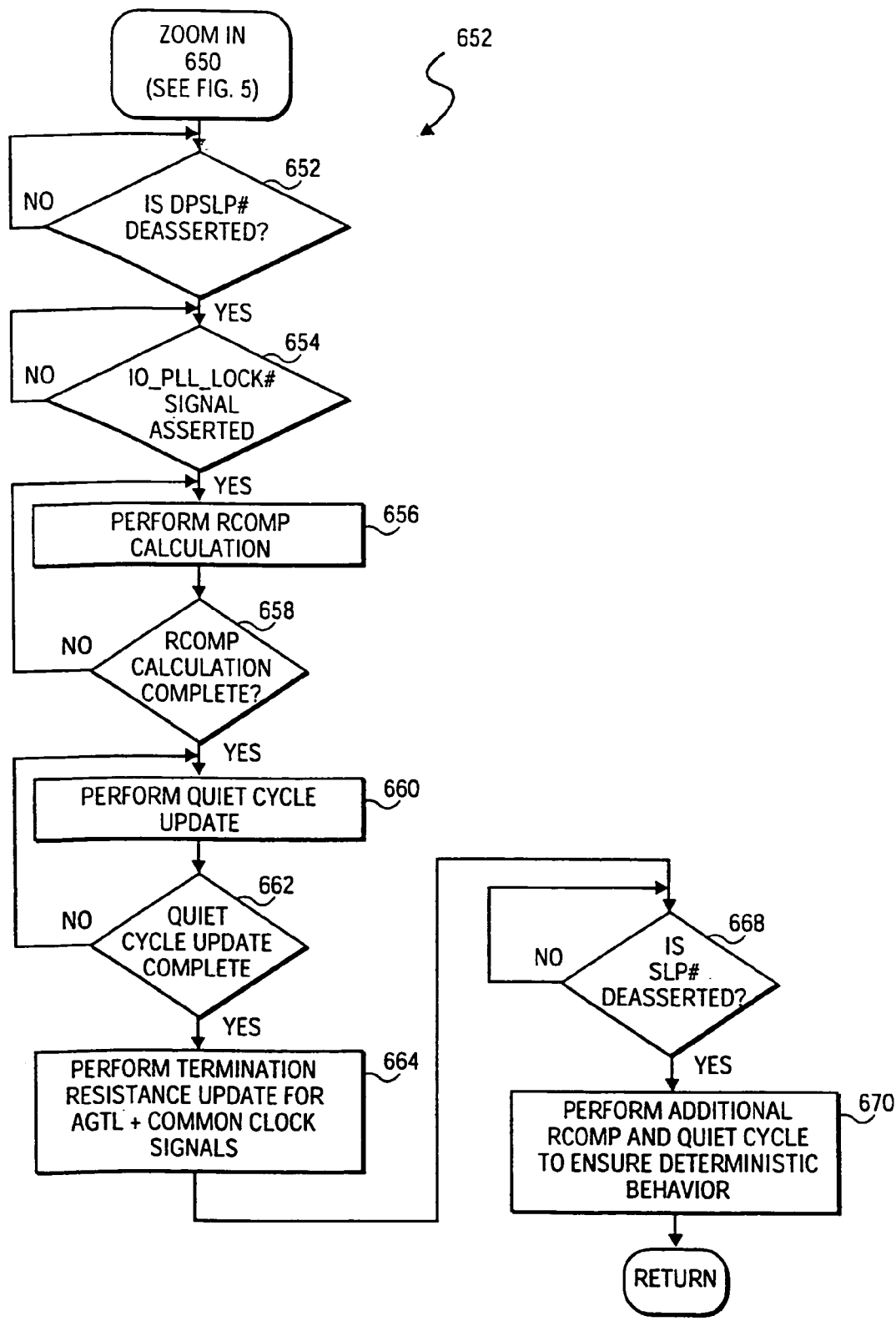
FIG. 8 is a flow chart that illustrates a termination update procedure performed during a bus agent's return to a normal power consumption state.

FIG. 8 is a flow chart illustrating a method 652 which is performed upon detecting exit from C3 (deep sleep) power management state, in returning to operation state 490, as shown in FIG. 5. After detecting that DPSLP# is deasserted (block 652), the process continues with block 654 where the TUU will determine whether an IO_PLL_LOCK# signal is asserted. Once asserted, the symmetric agent can determine that an I/O clock is stable. Accordingly, at process block 656, calculation of termination compensation values (Rcomp) is performed.

Once Rcomp is complete (block 658), process block 660 is performed. At process block 660, a Quiet Cycle update is performed wherein on-die termination impedance and/or buffer strength values are replaced with Rcomp values calculated at process block 656. Finally, at process block 664 termination update is performed for special treatment assisted gunning transistor logic (AGTL) signals, including BREQ# signal, BPRI# signal, BNR# signal, RESET# signal and BAM [3:0]# signal. Once block 664 is performed, control flow will go to state 490 (B0) upon deassertion of SLP# (checked in block 668). To ensure deterministic behavior of the bus, an additional Rcomp and Quiet Cycle update may be performed (block 670) upon SLP# being deasserted, prior to the symmetric agent entering power management mode C0 (see FIG. 7, where STPCLK# 640 is deasserted indicating that the processor enters mode C0). That is because in certain bus protocols, the deassertion of SLP# is deterministic and can therefore be used to synchronize the timing of Rcomp and Quite Cycle updates.

Figure 9:
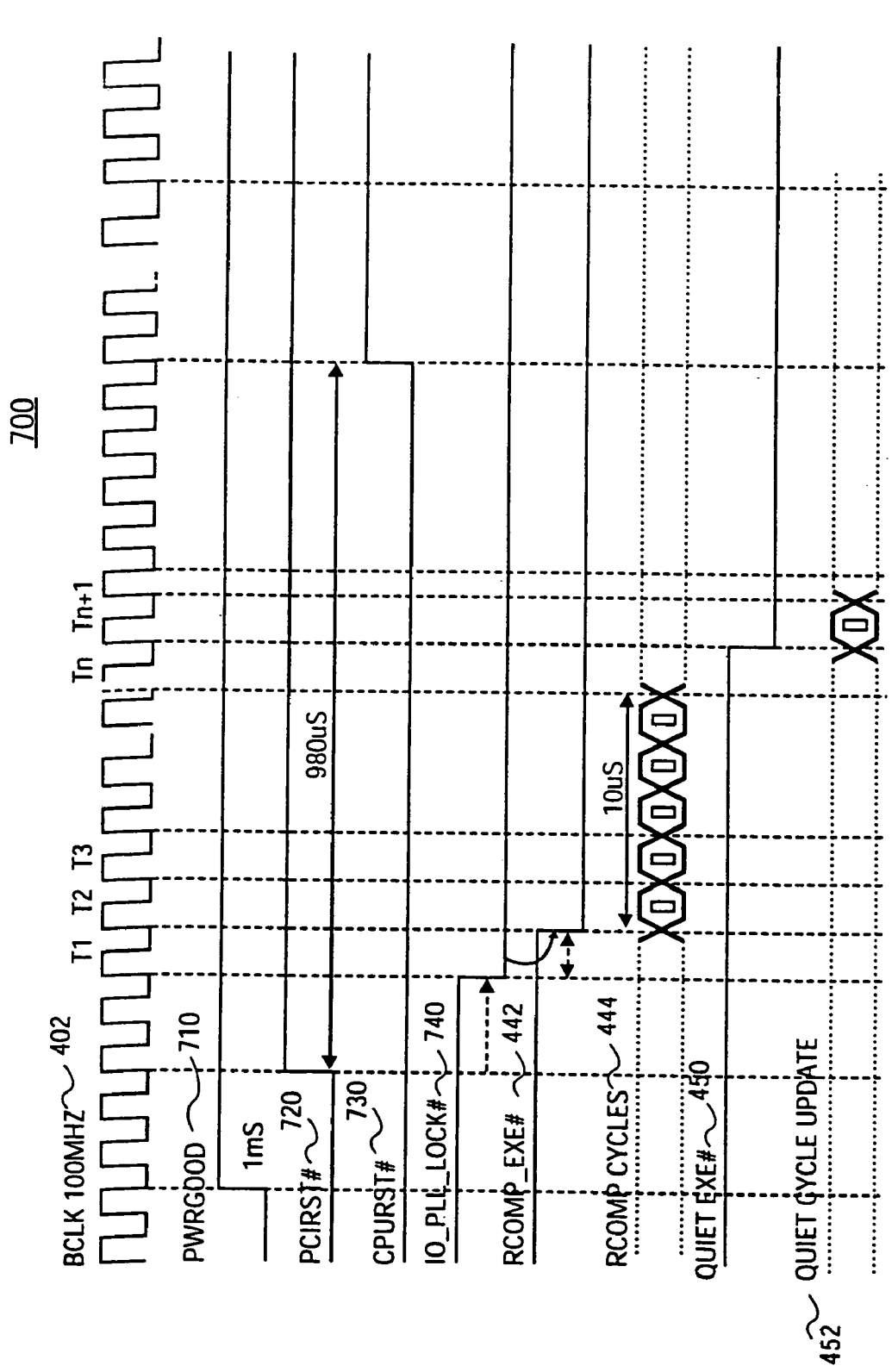
FIG. 9 is a timing diagram illustrating a termination update procedure following a system reset/startup event in a bus agent.

Referring now to FIG. 9, FIG. 9 is a timing diagram 700 for Quiet Cycle execution during system reset in accordance with a further embodiment of the present invention. During system reset, reset is detected when a processor reset signal (CPURST#) 730 is asserted. A power good signal (PWR-GOOD#) 710 being asserted will generally indicate initiation of normal operation for the symmetric agent. In response to the PWRGOOD signal 710 being asserted, the TUU will sample IO_PLL_LOCK# 740 such that once the latter signal is asserted Rcomp execution 442 may begin. Following Rcomp execution cycles 444, Quiet Cycle update 452 begins, since, as defined for certain bus protocols, there is one bus clock cycle available at that time, prior to activation of transactions on the bus, where it is guaranteed that no high speed signals (e.g. address and data signals) are present on the bus.

Figure 10:
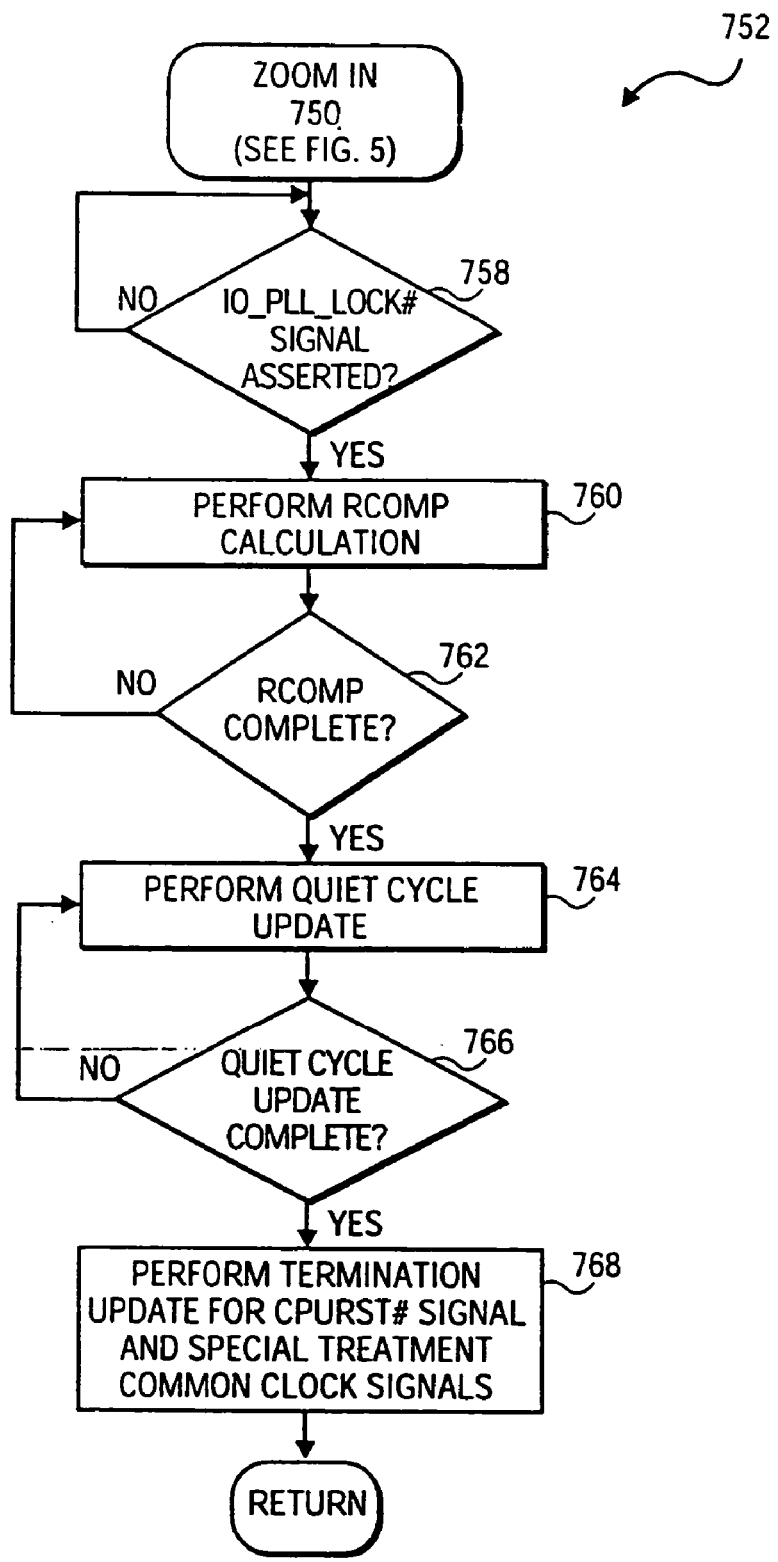
FIG. 10 is a flow chart illustrating a termination update procedure during a system reset operation of a bus agent.

FIG. 10 is a flow chart illustrating an additional method 752 for Quiet Cycle execution during system reset. At process block 758 it is determined whether an IO_PLL_LOCK# signal is asserted. Once asserted, Rcomp execution is performed at process block 760. Once completed, at process block 762, a Quiet Cycle execution is performed at process block 764. Once Quiet Cycle execution completes (checked in block 766), buffer strength and/or impedance updating for the various control signals is performed according to process 502 (see FIG. 6). Termination update may also be performed for the CPURST# signal, in block 768. In one embodiment, termination update is disabled for CPURST# signal during system power up. Finally, once the CPURST# signal termination is updated, control flow returns to process block 490 (see FIG. 5).

Rcomp

Advanced electronic systems such as modern notebook computers have significant thermal power dissipation and operate at low power supply voltage levels (e.g., at a bus line pull-up voltage of $V_{tt}$=1.05 Volts). In such systems, high resolution and wide dynamic range may be desirable in an adjustable termination circuit. For instance, some systems demand that target impedance accuracies be no worse than 10% and that their resolution be better than 2%. In addition, such systems may need frequent updates to their termination circuits, to achieve reliable high speed bus signaling during normal system operation and in the presence of temperature effects, voltage drift and fabrication process effects.

Higher resolution and wider dynamic range in Rcomp may be achieved by designing the adjustable termination circuits to have a digital or binary weighted compensation mechanism. Such a discrete step solution is suitable for systems in which the transistor characteristics of on-chip termination circuits, in bus I/O buffers, show greater variance as the supply voltage drops. For example, in one embodiment, the compensation value is represented by 7 bits and accordingly takes on 128 levels. An example of a buffer that is designed for such a compensation value is shown in FIG. 11.

Figure 11:
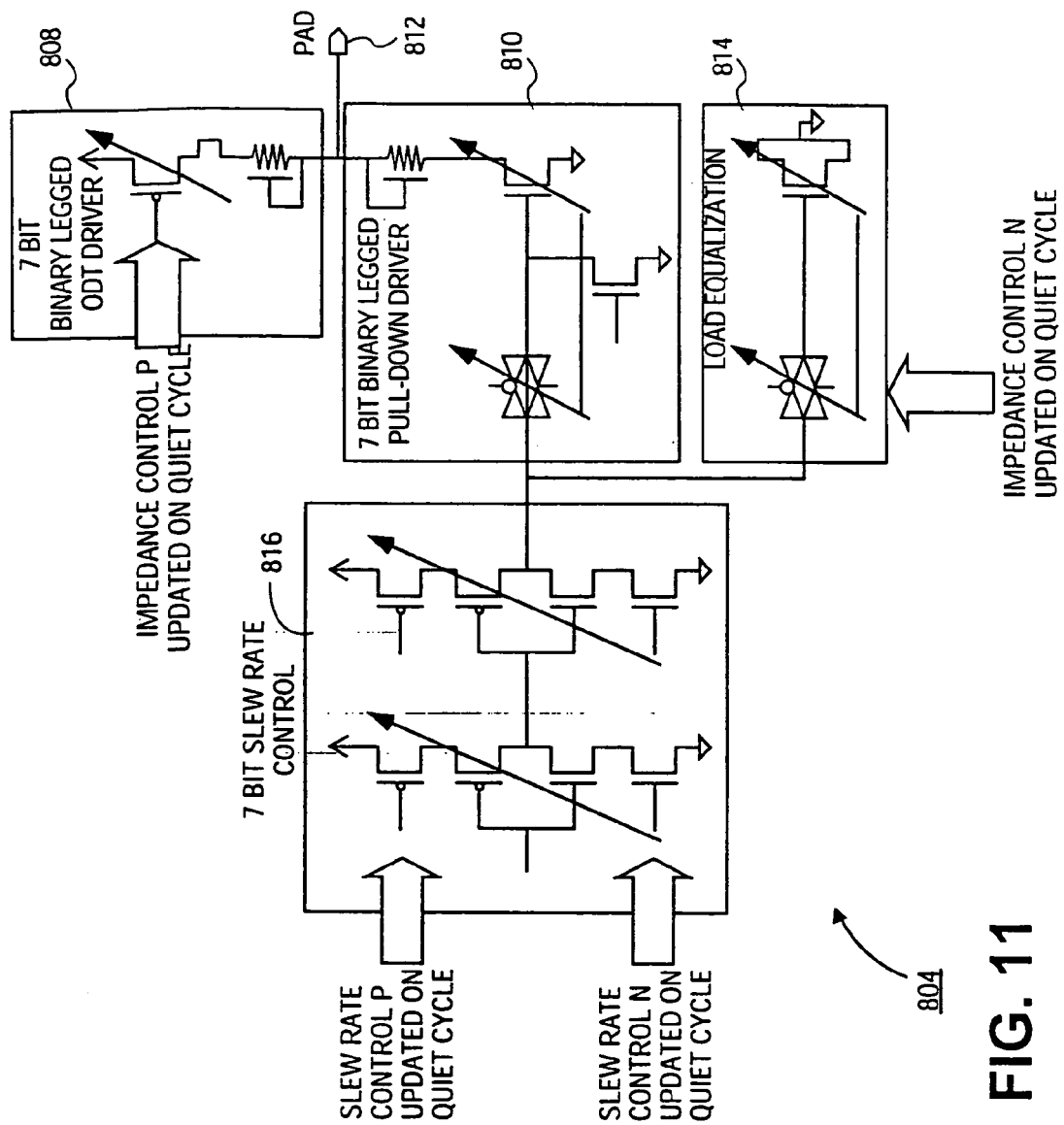
FIG. 11 depicts a circuit schematic of part of an I/O buffer designed for digital termination updates.

FIG. 11 shows a circuit schematic of an example of part of an I/O buffer 804 with digital termination update capability (a receiver of the buffer is not shown). In this version, the buffer 804 has a 7-bit binary legged on-die termination (ODT) driver 808 that is electrically connected to pull up on the pad 812. The pad 812 of the integrated circuit die 110 (see FIG. 1) is electrically connected to a bus line (not shown). In addition, this version of the buffer 804 has a pull-down driver 810 that is also 7-bit binary weighted and which pulls down on the pad 812. A digital impedance compensation value for the P side (driver 808) is received from the termination update unit and that sets the effective pull-up resistance on the pad 812. A compensation value for the N-side, that is driver 810, may also be provided. The compensation value for the N-side can also be used to adjust a load equalization circuit 814.

The pull-down driver 810 is driven by the output of, in this case, a 7-bit slew rate control circuit 816. The strength of the slew rate control circuit 816 should be calibrated to achieve tight control of the output slew rate and minimal up/down transition skew. The circuit 816 itself is adjustable, and receives compensation values for its P and N sides as shown. Some or all of these adjustable circuits of the buffer 804 may be updated in each Quiet Cycle. Other types of termination circuits, including discretely adjustable, as well as continuously adjustable ones, can alternatively be used, depending upon whether the termination requirements in terms of dynamic range and resolution can be met.

In some cases, the new compensation value is significantly different than the one currently implemented in the termination circuit. In that case, adjusting the termination circuit digitally, that is by discrete steps, may cause a glitch at the output of an I/O buffer, if at the same time the buffer is operating to receive an input signal. This glitch may be caused by timing differences in the control signals that are applied to transistor switches within the termination circuit, where such timing differences create transitions through very high or very low impedance states on the bus signal line. The use of Quiet Cycle updates help avoid such glitches, because the Quiet Cycle is positioned in one or more bus clocks during which only minimal toggling of the high speed bus signals associated with the buffers being updated can be expected.

Figure 12:
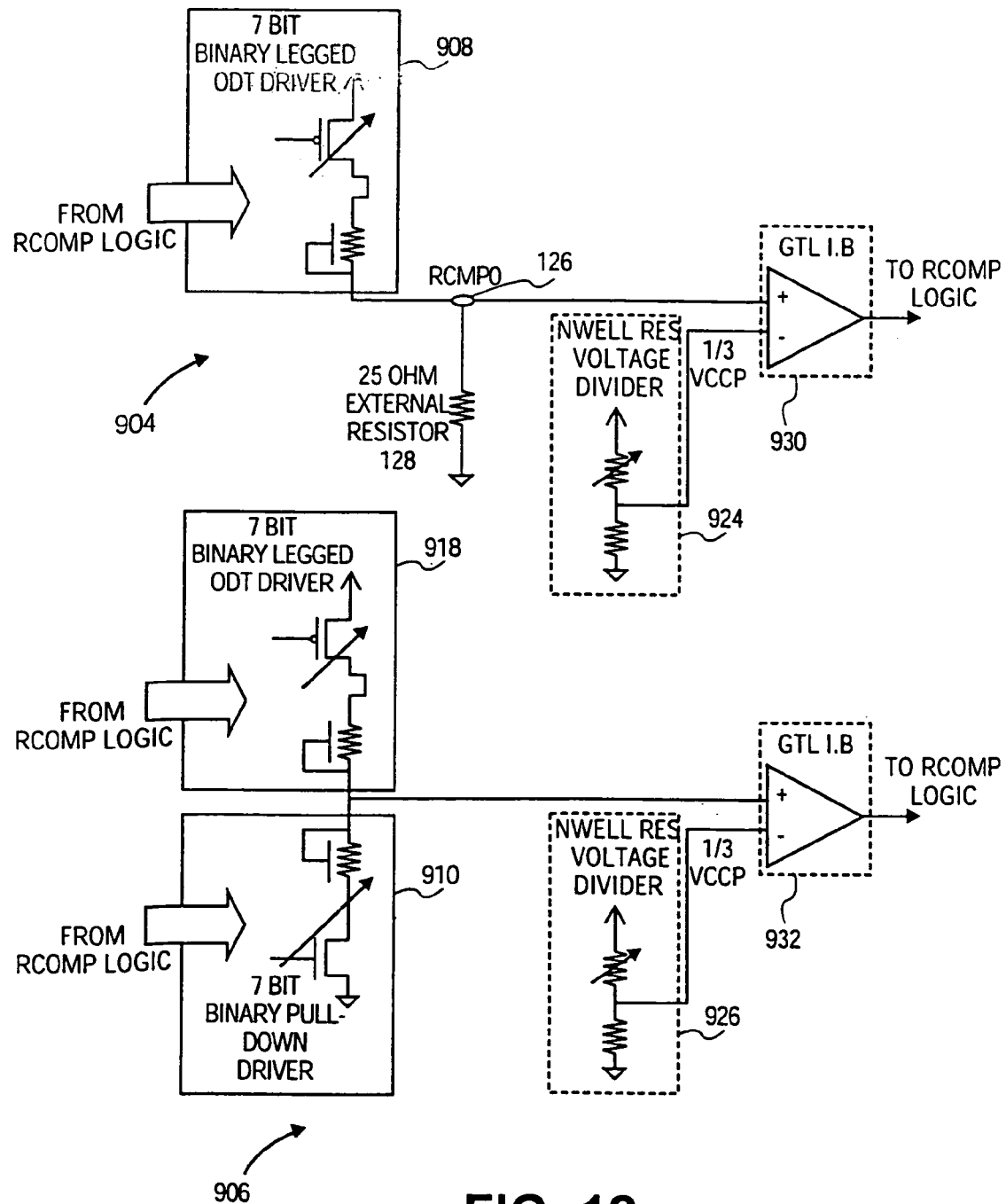
FIG. 12 shows a circuit schematic of a technique for determining a pull-up impedance aspect of the termination update.
Figure 13:
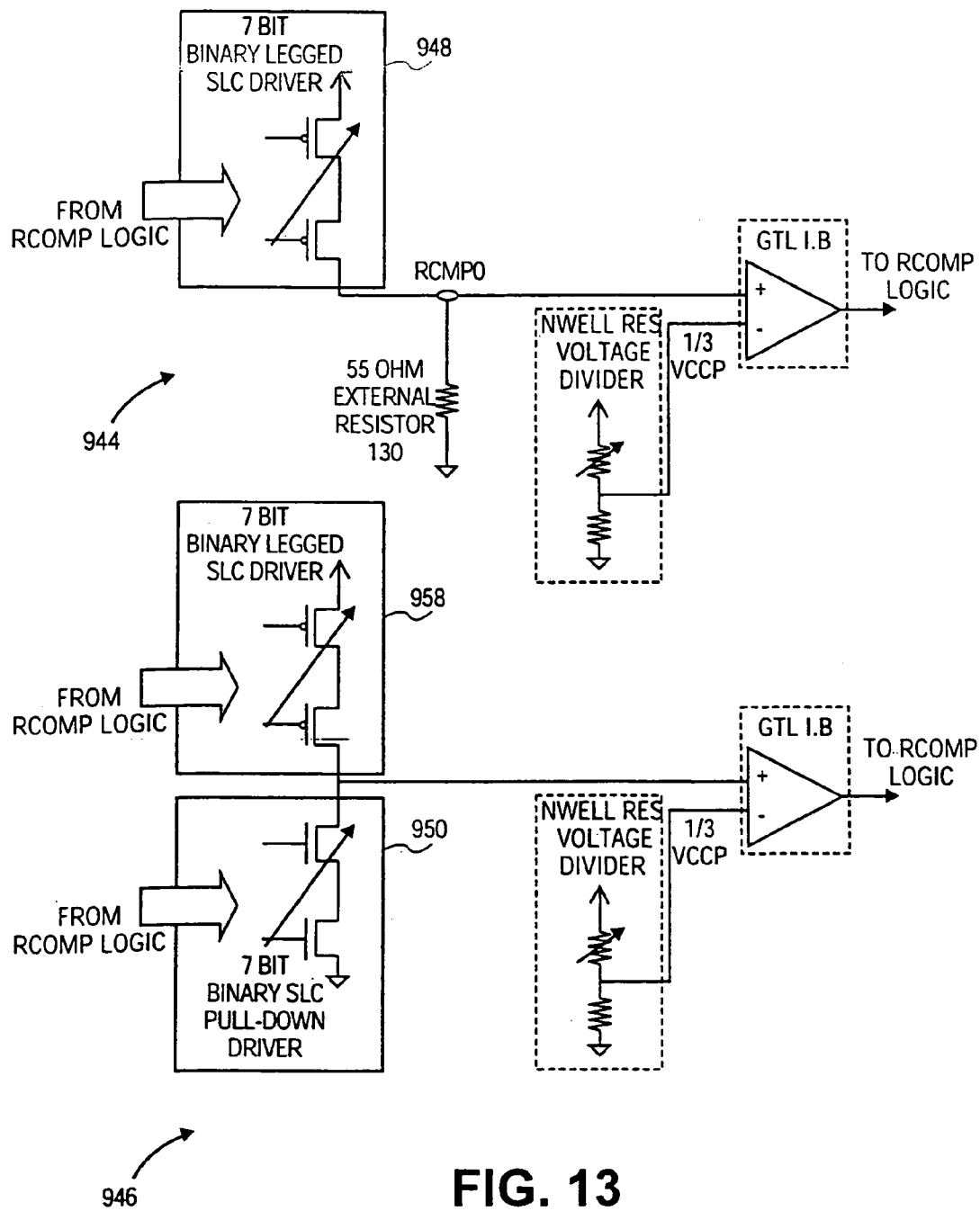
FIG. 13 illustrates a circuit schematic of a technique for determining a slew rate capability aspect of the termination update.

Note that, with reference to FIG. 11, a new compensation value may result in at least one of the following being updated in the buffer 804: slew rate control (P side), slew rate control (N side), pull-up impedance control, and pull-down impedance control and load equalization. FIGS. 12 and 13 show examples of techniques that can be used to determine the compensation value. In FIG. 12, a compensation value of the pull-up impedance is determined using special circuitry 904 that includes replicate 908 of the driver 808 (FIG. 11). This circuit can be used to calibrate the buffer strength on the fly, during the Rcomp cycles mentioned above. The resulting binary code of the pull-up impedance may be distributed to essentially all the I/O buffers of the on-chip bus agent during a Quiet Cycle.

The replicate driver 908 is coupled to the Rcomp pad 126. Its strength is calibrated against a fixed resistor 128 that may be installed on the system printed wiring board (not shown). The voltage at pad 126 is compared to a reference level of, in this case, one-third VCCP. This reference level may be generated internally on die, by a voltage divider 924 as shown. When the voltage of the pad 126 equals the reference voltage, as determined using a comparator 930, the required code for the driver 808 has been determined where in this case the resistance presented by the replicate 908 is twice that of the external resistor 128. Accordingly, the resistance of the driver 808 is, in this case, calibrated to be about 50 Ohms.

After the calibration of the replicate 908 using the Rcomp pad 126 has been completed, the resulting information is used to calibrate the pull-down driver 810 using replicate 910 which is part of special circuitry 906. A replicate 918 of the driver 808, configured according to the code determined using the special circuitry 904, will serve as an on-die reference resistor, to calibrate the pull-down driver 810. The code applied to the replicate 910 is altered until the resulting output voltage is once again one-third VCCP, as determined using voltage divider 926 and comparator 932. In this case, the calibrated pull-down resistance will have reached one-half that of the driver 808 resistance value, i.e., 25 Ohms.

The above-described calibrations using special circuitry 904 and 906 can be performed and applied "one the fly" during the Rcomp cycles, while the bus is in normal operation. Upon completion of the calibration, the driver 808 and driver 810 codes can be distributed and applied to all of the I/O buffers of the bus agent during a Quiet Cycle.

FIG. 13 is in many ways similar to FIG. 12, depicting special circuitry 944 and 946 used for calibration of slew rate control circuitry 816, using replicates 948 and 950. The replicates 948, 958 and 950 used in FIG. 13 may be scaled versions of the slew rate control circuit 816 in the actual buffer 804. One of ordinary skill in the art can use the special circuitry shown in FIG. 13 to implement a calibration technique that determines the binary codes for the slew rate control replicates and 948 and 950, once again with the help of a precision external resistor 130 which is in this case of 55 Ohms. These codes also referred to as compensation values are also applied to the binary weighted slew rate control circuits 816 in the actual buffers 804, during a Quiet Cycle as described above. Other digital termination compensation schemes, however, including other calibration schemes, may be used.

An additional advantage of a digital termination compensation scheme is that it allows the design of the bus agent I/O buffers to scale better, as the supply voltage drops below one Volt.

The embodiments of the invention described above can be represented using a hardware description language, or another functional description language, which essentially provides a computerized model of how the designed hardware is expected to perform. The hardware model may be stored in a storage medium, such as a computer memory, so that the model may be simulated using simulation software that applies a particular test suite to the hardware model to determine if it indeed functions as intended. In some embodiments, the simulation software is not recorded, captured or contained in the medium.

Additionally, a circuit level model with logic and/or transistor gates may be produced at some stages of the design process. The model may be similarly simulated some times by dedicated hardware simulators that form the model using programmable logic. This type of simulation taken a degree further may be an emulation technique. In any case, reconfigurable hardware is another embodiment that may involve a machine readable medium storing a model employing the disclosed techniques.

Furthermore, most designs at some stage reach a level of data representing the physical placements of various devices it the hardware model. In the case where conventional semiconductor fabrication techniques are used, the data representing the hardware model may be data specifying the presence or absence of various features on different mask layers or masks used to produce the integrated circuit. Again, this data representing the integrated circuit embodies the techniques disclosed in that the circuitry logic and the data can be simulated or fabricated to perform these techniques.

In any representation of the design, the data may be stored in any form of a machine readable medium. An optical or electrical wave modulated or otherwise generated to transport such information, a memory or a magnetic or optical storage, such as a disk, may be the machine readable medium. Any of these mediums may "carry" the design information.

In the above description, for the purposes of explanation, numerous specific details are set forth in order to provide a thorough understanding of the embodiments of the present invention. It will be apparent, however, to one skilled in the art that the various embodiments of the present invention may be practiced without some of these specific details. In addition, the description provides examples, and the accompanying drawings show various examples for the purposes of illustration. One of skill in the art will immediately appreciate that the embodiments of the invention can be practiced with electronic system configurations other than those described above. For instance, the TUU may be part of an integrated circuit die other than a processor die, and the symmetric agent need not be a processor. In other words, the examples should not be construed in a limiting sense as they are merely intended to provide examples of the embodiments of the present invention rather than to provide an exhaustive list of all possible implementations of the embodiments of the present invention. In other instances, well-known structures and devices are shown in block diagram form in order to avoid obscuring the details of various embodiments of the present invention.

What is claimed is:

1. A method comprising:
    (a) determining a value to match a termination circuit to a characteristic impedance of a bus signal line;
    (b) tracking bus protocol events to determine when a bus, that includes the line and that is used by a bus agent in a power consumption mode of operation, is available for adjusting the termination circuit; and
    (c) when the bus becomes available as determined in (b), adjusting the termination circuit according to the determined value.

2. The method of claim 1 further comprising repeating (a) through (c) every predetermined time interval while the bus is being used by the agent in the power consumption mode of operation.

3. The method of claim 2 wherein adjusting the termination circuit comprises turning a transistor of the termination circuit on or off to make a discrete change in one of slew rate and pull-up impedance for an I/O buffer of the bus line.

4. The method of claim 3 wherein a pull-up voltage of the bus line is about 1 Volt or less.

5. The method of claim 1 wherein the value is determined by a voltage divider technique involving a precision off-chip resistor.

6. An integrated circuit die, comprising:
    a bus agent having a plurality of bus I/O buffers each with a discretely adjustable on-chip termination circuit and each being designed to operate with a bus line pull-up supply voltage of about 1 Volt or less; and
    an on-chip termination update unit (TUU) coupled to the plurality of buffers to change a termination of each of the plurality of buffers while the bus agent is operating in a power consumption modes,
    wherein the TUU is to determine when a time interval is available, during operation of the bus agent in the power consumption mode, during which the termination of the plurality of buffers can be changed in discrete steps, without forcing a bus idle condition and without hampering the receipt of bus data symbols by the plurality of I/O buffers.

7. The integrated circuit of claim 6 wherein the termination takes on any one of at least 128 values represented by at least seven bits.

8. The integrated circuit of claim 6 further comprising a compensation pad to which an off-chip precision resistor is to be connected, the TUU to determine a termination compensation value, using the precision resistor, according to which the termination of the plurality of buffers is changed.

9. An electronic system comprising:
    a bus;
    a chipset integrated circuit (IC) coupled to the bus as a priority bus agent;

a processor IC having a plurality of bus buffers coupled to the bus, each of the plurality of buffers having a discretely adjustable on-chip termination circuit and designed to receive a supply voltage of about 1 Volt or less; and a termination update unit (TUU) to change a termination of each of the plurality of buffers, while the processor is running in a power consumption state, in a time interval detected based on monitoring bus protocol events on the bus and knowledge of whether or not there is a pending transaction on the bus.

10. The system of claim 9 wherein the system bus is formed in a printed wiring board on which the processor and chipset ICs are installed as part of separate IC packages.

11. The system of claim 10 further comprising a display coupled to the chipset and a battery coupled to power the system, the system being integrated into a portable housing.

12. The system of claim 9 wherein the TUU is to monitor an arbitration event and a request phase on the bus.

* * * * *

UNITED STATES PATENT AND TRADEMARK OFFICE
CERTIFICATE OF CORRECTION

| | |
|---|---|
| PATENT NO. | : 7,227,377 B2 |
| APPLICATION NO. | : 11/026651 |
| DATED | : June 5, 2007 |
| INVENTOR(S) | : Kurts et al. |

It is certified that error appears in the above-identified patent and that said Letters Patent is hereby corrected as shown below:

In column 1, at line 27, delete "dock" and insert --clock--.

In column 11, at line 45, delete "it" and insert --in--.

In column 12, at line 48, delete "modes," and insert --mode,--.

Signed and Sealed this

Fifteenth Day of April, 2008

JON W. DUDAS
*Director of the United States Patent and Trademark Office*